US010396208B2

(12) United States Patent
Cheng et al.

(10) Patent No.: US 10,396,208 B2
(45) Date of Patent: Aug. 27, 2019

(54) VERTICAL TRANSISTORS WITH IMPROVED TOP SOURCE/DRAIN JUNCTIONS

(71) Applicant: INTERNATIONAL BUSINESS MACHINES CORPORATION, Armonk, NY (US)

(72) Inventors: Kangguo Cheng, Schenectady, NY (US); Muthumanickam Sankarapandian, Niskayuna, NY (US); Ruilong Xie, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/406,022

(22) Filed: Jan. 13, 2017

(65) Prior Publication Data

US 2018/0204950 A1     Jul. 19, 2018

(51) Int. Cl.
| H01L 21/8234 | (2006.01) |
| H01L 29/786 | (2006.01) |
| H01L 29/423 | (2006.01) |
| H01L 29/66 | (2006.01) |
| H01L 21/306 | (2006.01) |

(52) U.S. Cl.
CPC .. *H01L 29/78618* (2013.01); *H01L 29/42392* (2013.01); *H01L 29/66666* (2013.01); *H01L 29/78642* (2013.01); *H01L 29/78696* (2013.01); *H01L 21/30608* (2013.01)

(58) Field of Classification Search
CPC ......... H01L 29/42392; H01L 29/66666; H01L 21/823487
See application file for complete search history.

(56) References Cited

U.S. PATENT DOCUMENTS

| 4,262,296 A | 4/1981 | Shealy et al. |
| 6,156,611 A | 12/2000 | Lan et al. |
| 6,660,590 B2 | 12/2003 | Yoo |
| 6,846,709 B1 | 1/2005 | Lojek |
| 7,033,877 B2 | 4/2006 | Chaudhry et al. |
| 7,683,428 B2 | 3/2010 | Chidambarrao et al. |

(Continued)

OTHER PUBLICATIONS

List of IBM Patents or Patent Applications Treated as Related; (Appendix P), Filed Mar. 9, 2018; 2 pages.

*Primary Examiner* — Mark V Prenty
(74) *Attorney, Agent, or Firm* — Cantor Colburn LLP; Vazken Alexanian

(57) ABSTRACT

A method of fabricating a top source/drain junction of a vertical transistor includes forming a structure including a bottom source/drain, a fin channel extending vertically from the bottom source/drain, and a gate arranged around the fin channel, the gate including a dielectric layer, a gate metal, and spacers arranged on top and bottom surfaces of the gate; etching to form a recess in a top surface of the fin, the recess having sidewalls that form oblique angles with respect to sidewalls of the fin; forming a top source/drain on the fin and within the recess; doping the top source/drain with a dopant; and annealing to diffuse the dopants from the top source/drain into the fin.

13 Claims, 7 Drawing Sheets

(56) References Cited

U.S. PATENT DOCUMENTS

| | | | |
|---|---|---|---|
| 7,696,539 B2 | 4/2010 | Li et al. | |
| 7,994,014 B2 | 8/2011 | Yang et al. | |
| 8,310,002 B2 | 11/2012 | Fujimoto | |
| 8,878,300 B1 | 11/2014 | Liu et al. | |
| 9,196,730 B1 * | 11/2015 | Yu | H01L 29/66666 |
| 9,287,271 B2 | 3/2016 | Wang et al. | |
| 9,653,288 B1 * | 5/2017 | Holland | H01L 29/0676 |
| 9,972,494 B1 * | 5/2018 | Bentley | H01L 29/66742 |
| 2014/0203350 A1 * | 7/2014 | Chuang | H01L 29/66356 |
| | | | 257/329 |
| 2015/0079751 A1 | 3/2015 | Alptekin et al. | |
| 2015/0236134 A1 | 8/2015 | Zhong et al. | |
| 2016/0020306 A1 * | 1/2016 | Huang | H01L 29/41775 |
| | | | 257/105 |
| 2016/0315172 A1 * | 10/2016 | Wu | H01L 29/0847 |
| 2018/0204950 A1 * | 7/2018 | Cheng | H01L 29/78618 |

* cited by examiner

VERTICAL TRANSISTORS WITH IMPROVED TOP SOURCE/DRAIN JUNCTIONS

BACKGROUND

Embodiments of the present invention relate to complementary metal oxide semiconductor (CMOS) technology, and more specifically, to top source/drain junctions in vertical transistors.

CMOS technology is used to construct integrated circuits such as microprocessors, microcontrollers, static random access memory (RAM) and other digital logic circuits. A basic component of CMOS designs is metal oxide semiconductor field effect transistors (MOSFETs). As MOSFETs are scaled to smaller dimensions, various designs and techniques are employed to improve device performance. Vertical transistors, in which source/drain regions are arranged on opposing ends of a vertical channel region, are attractive candidates for scaling to smaller dimensions.

SUMMARY

According to an embodiment, a method of fabricating a top source/drain junction of a vertical transistor includes forming a structure including a bottom source/drain, a fin channel extending vertically from the bottom source/drain, and a gate arranged around the fin channel, the gate including a dielectric layer, a gate metal, and spacers arranged on top and bottom surfaces of the gate; etching to form a recess in a top surface of the fin, the recess having sidewalls that form oblique angles with respect to sidewalls of the fin; forming a top source/drain on the fin and within the recess; doping the top source/drain with a dopant; and annealing to diffuse the dopants from the top source/drain into the fin.

According to another embodiment, a method of fabricating a top source/drain junction of a vertical transistor includes forming a structure including a bottom source/drain, a fin channel extending vertically from the bottom source/drain, and a gate arranged around the fin channel, the gate including a dielectric layer, a gate metal, and spacers arranged on top and bottom surfaces of the gate; etching to form a recess in a top surface of the fin, the recess having sidewalls that form oblique angles with respect to sidewalls of the fin; forming a top source/drain on the fin; doping the top source/drain with a dopant; and heating the top source/drain using a laser and then cooling to diffuse the dopant into the fin.

Yet, according to another embodiment, a vertical transistor includes a bottom source/drain arranged on a substrate; a fin channel extending vertically from the bottom source/drain; a top source/drain arranged within a recess on a top surface of the fin, the top source/drain including doped epitaxy, and the recess having a sidewall that forms an oblique angle with a sidewall of the fin; and a gate arranged around the fin channel, the gate comprising a dielectric layer, a gate metal, and spacers arranged on top and bottom surfaces of the gate.

BRIEF DESCRIPTION OF THE DRAWINGS

The subject matter which is regarded as embodiments of the invention is particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1 and 2 illustrate challenges associated with optimal top source/drain-to-gate junction overlap, in which:

FIG. 1 is an exemplary process flow including a deep fin recess; and

FIG. 2 is an exemplary process flow including a shallow fin;

FIGS. 3-6 illustrate a process flow for fabricating vertical transistors with improved source/drain junctions according to embodiments, in which:

FIG. 3 is a cross-sectional side view of a vertical transistor structure including a fin and fin hard mask;

FIG. 4 is a cross-sectional side view after removing the fin hard mask and etching to form a recess in the fin;

FIG. 5 is a cross-sectional side view after epitaxially growing a top source/drain region on the fin with in-situ doping; and FIG. 6 is a cross-sectional side view after annealing to diffuse dopants into the junction.

DETAILED DESCRIPTION

Figure 1:
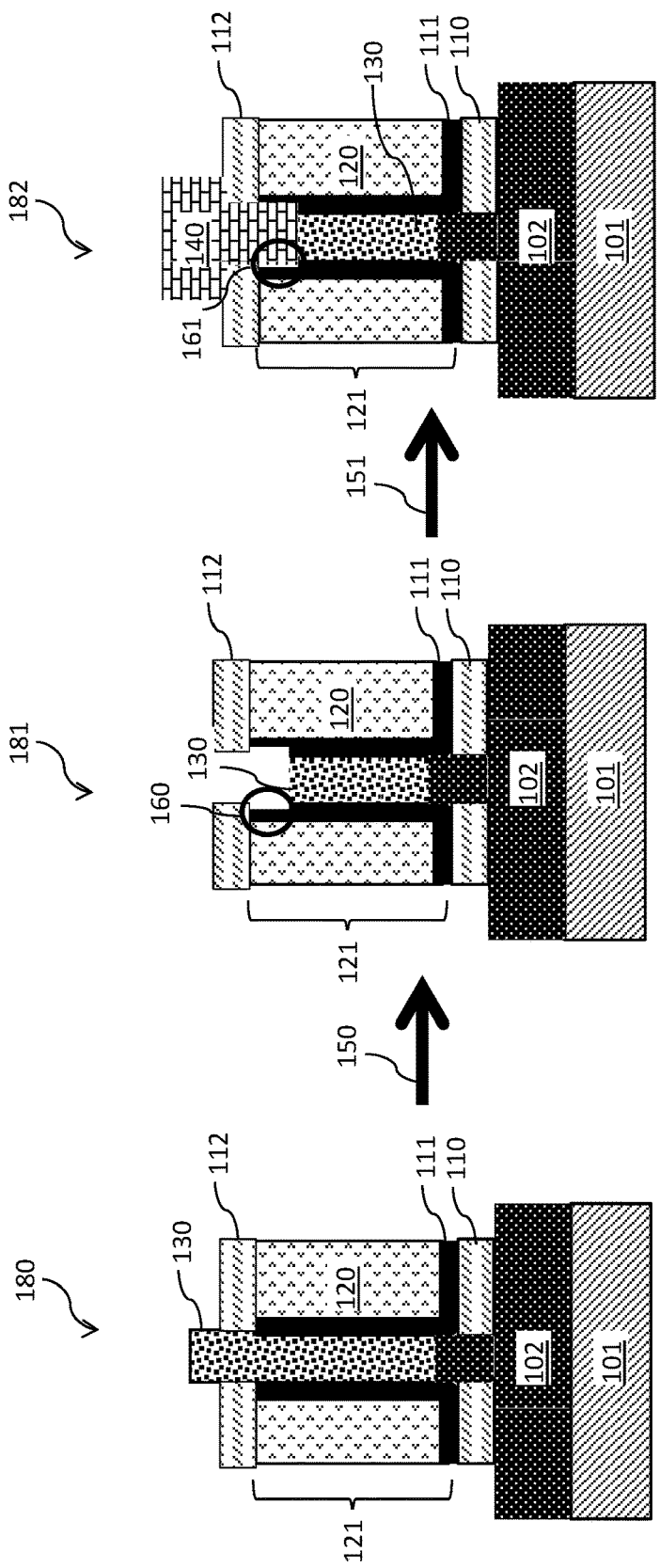

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular structure or characteristic, but every embodiment may or may not include the particular structure, or characteristic. Moreover, such phrases are not necessarily referring to the same embodiment. Further, when a particular structure or characteristic is described in connection with an embodiment, it is submitted that it is within the knowledge of one skilled in the art to affect such structure or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, vertical transistors are being explored as options for 7 nm node devices and beyond. One challenge associated with vertical transistors is forming adequate junction overlap of the top source/drain terminal to the gate.

Figure 2:
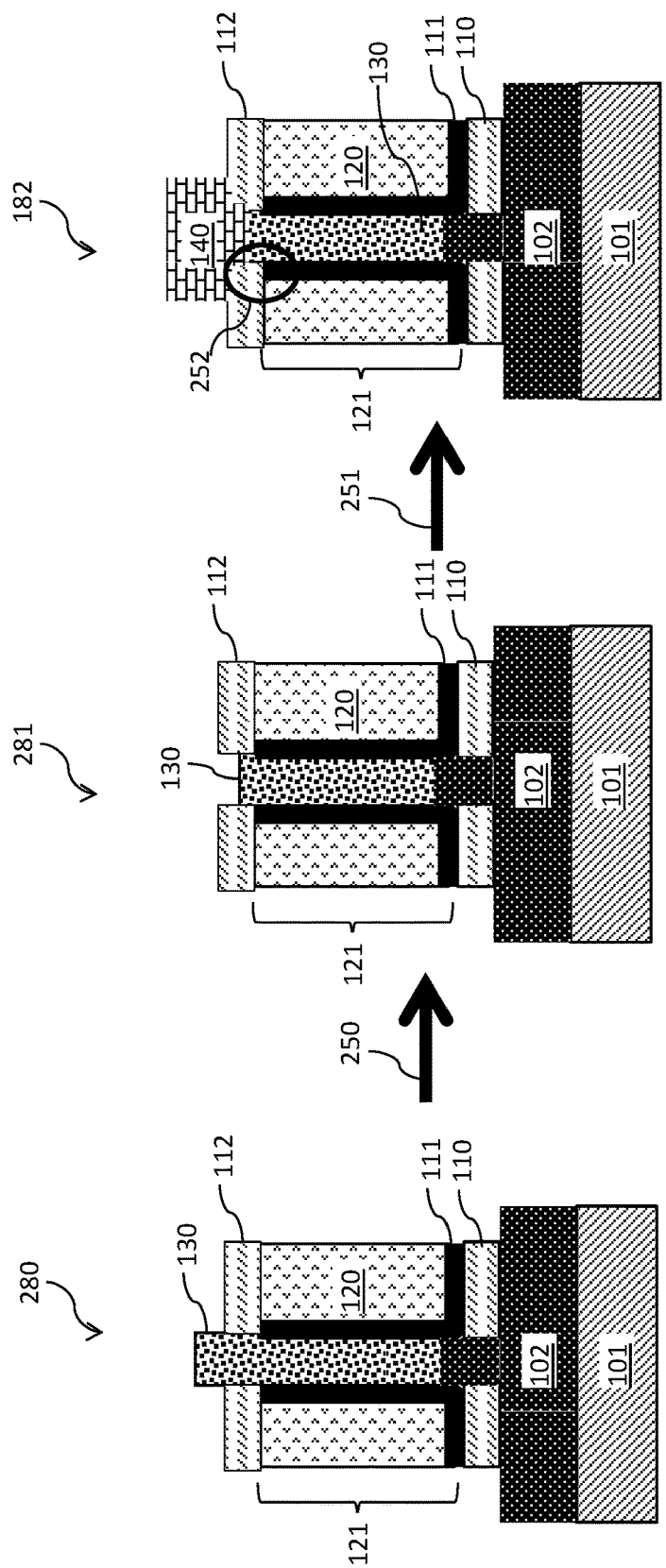

FIGS. 1 and 2 are exemplary process flows that illustrate some of these challenges associated with optimal source/drain-to-gate junction overlap. FIG. 1 is an exemplary process flow including a deep fin recess to ensure junction overlap. The starting vertical transistor 180 includes a bottom source/drain 102 arranged on a substrate 101. A fin 130 (channel) extends vertically from the bottom source/drain 102 and is surrounded by a gate stack 121. The gate stack 121 includes a dielectric layer 111 and a metal gate 120 fill. The dielectric layer 111 can be, for example, a high-k dielectric. Gate spacers (first spacer 110 and second spacer 112) are arranged on opposing sides of the gate. The first gate spacer 110 is arranged between the gate stack 121 and the bottom source/drain 102. The second gate spacer 112 is arranged on top of the gate stack 121.

After forming the vertical transistor 180 starting structure, a deep fin 130 recess 150 is performed to form transistor 181. The fin 130 is recessed below the top of the dielectric layer 111 to form an overlap junction. However, as shown in the transistor 181, deep fin recessing can result in exposing and thinning the dielectric layer 181 in the region 160. In-situ doped epitaxial processing 151 is performed on the fin 130 to form the top source/drain 140 and an overlapped junction 161 between the top source/drain 140 and the gate stack 121. However, as shown in the resulting transistor 182, exposing the thinned dielectric layer 111 in the overlapped junction 161 can cause device reliability problems. Also exposing the dielectric layer 111 to the epitaxial process can induce contamination of the epitaxy tool.

FIG. 2 is another process flow that illustrates challenges associated with optimal overlapping junctions. In particular, FIG. 2 shows challenges associated with using a shallow fin recess to mitigate gate dielectric exposure and damage. After forming the starting transistor 280, a shallow fin recess 250 is performed to form in attempts to mitigate dielectric layer 111 exposure and damage. The fin 130 is recessed to a level above the dielectric layer 111 and gate stack 121 in the transistor 281. Then in-situ doped epitaxial processing 251 is performed on the fin 130 to form the top source/drain 140. Although shallowing fin recessing followed by epitaxy avoids reliability and contamination issues, as shown in the region 252, partial/shallow fin recessing can result in an underlapped junction in the region 252 between the top source/drain 140 and the gate stack 121. Underlapped junctions can increase the external resistance and degrade transistor performance.

Therefore, for at least the reasons described above, there is a need for improvements in forming top source/drain-to-gate junction overlap in vertical transistors. Accordingly, various embodiments described herein provide process flows and resulting structures that provide improved source/drain-to-gate junction overlap in vertical transistors.

Turning now to an overview of aspects of the present invention, one or more embodiments provide sufficient top source/drain-to-gate junction overlap by providing a self-limiting fin etch, followed by forming a top source/drain on the etched fin.

Figure 3:
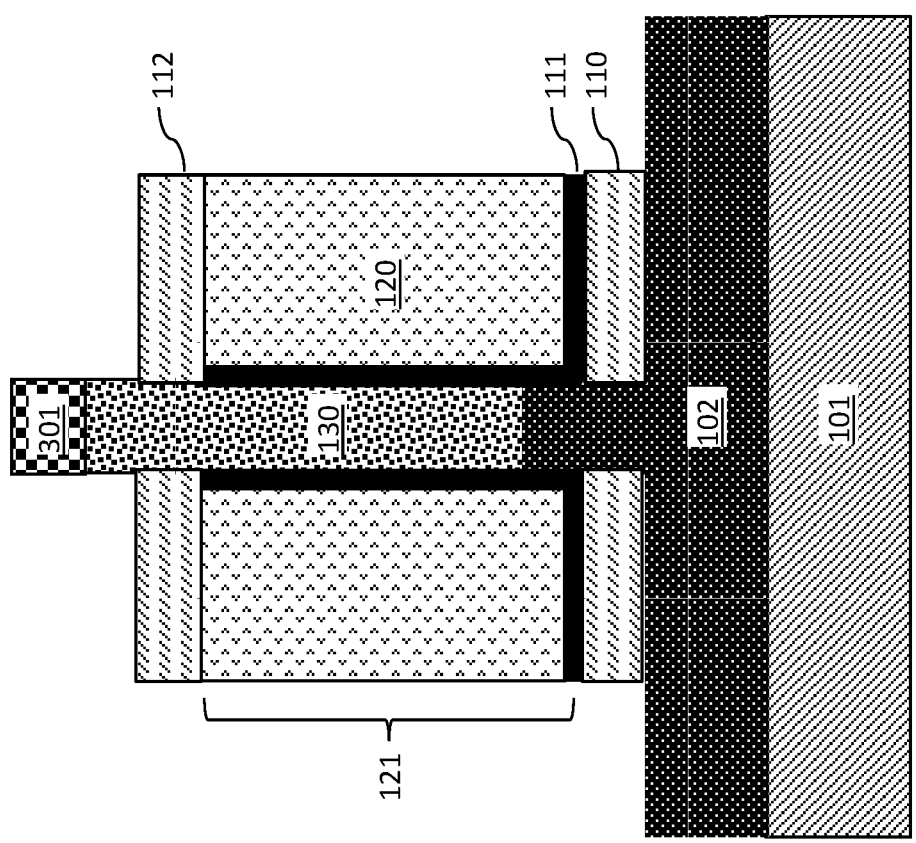

Turning now to a detailed description of aspects of the present invention, FIGS. 3-6 illustrate a process flow for fabricating vertical transistors with improved source/drain-to-gate junctions according to embodiments. FIG. 3 is a cross-sectional side view of a vertical transistor structure including a fin 130 and fin hard mask 301 arranged on the top of the fin 130.

The substrate 101 can include one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The fin 130 can be formed in the substrate 101 by, for example, depositing and patterning a hard mask material over the substrate 101. The fin 130 can be patterned in the substrate 101 by, for example, sidewall imaging transfer. The fin 130 extends extend vertically from the substrate 101 and the bottom source/drain 102.

A bottom source/drain 102 (first source/drain) is formed in the substrate 101 beneath the fin 130. The bottom source/drain 102 can be formed by, for example, depositing an epitaxial layer onto the substrate 101. Alternatively, the bottom source/drain 102 can be formed by incorporating dopants into the substrate 101. Epitaxial growth can be grown using, for example, vapor-phase epitaxy (VPE), molecular-beam epitaxy (MBE), liquid-phase epitaxy (LPE), or other suitable process. The epitaxial silicon, silicon germanium, and/or carbon doped silicon (Si:C) can be doped during deposition by adding a dopant or impurity during or after epitaxy.

Gate stacks 121 are formed on bottom source/drain 102 and around the fin 130. Each gate stack 121 includes a gate stack that includes a dielectric layer 111 and a metal gate 120. The dielectric layer 111 can be a dielectric material having a dielectric constant greater than 3.9, 7.0, or 10.0, for example. Non-limiting examples of suitable materials for the dielectric layer 111 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The dielectric layer 111 can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric layer 111 can vary depending on the deposition process as well as the composition and number of dielectric materials used.

The metal gate 120 of the gate stack 121 includes one or more metal layers. The metal gate 120 can include a work function metal arranged on the dielectric layer 111 and a gate metal that fills the gate area. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The conductive gate metal can then be deposited on the work function metal. Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering.

The gate stack 121 includes bottom gate spacer 110 (first gate spacer) and top gate spacer 112 (second gate spacer) arranged on opposing sides of the gate stack 121. The bottom gate spacer 110 contacts the bottom source/drain 102 and extends to the dielectric layer 111 of gate stack 121. The top gate spacer 112 contacts the top surface of the gate stack 121. The fin 130 extends over the top gate spacer 112.

The bottom gate spacer 110 and top gate spacer 112 can include any suitable dielectric material or a combination of multiple dielectric materials. The spacer material can include silicon, oxygen, nitrogen, carbon and/or boron. For example, the spacer material can include silicon oxide, silicon nitride, silicon oxynitride, SiBN, SiCN, SiOC, SiOCN, SiBCN, or any combination thereof.

A fin hard mask 301 is arranged on a top surface of the fin 130 to protect the fin 130. Non-limiting examples of suitable materials for the fin hard mask 301 include dielectric oxides (e.g., silicon oxide), dielectric nitrides (e.g., silicon nitride), dielectric oxynitrides, or any combination thereof. The fin hard mask 301 is deposited by a deposition process, for example, chemical vapor deposition (CVD) or physical vapor deposition (PVD). The fin hard mask 301 material can be etched by a dry etch process, for example, a RIE process.

Figure 4:
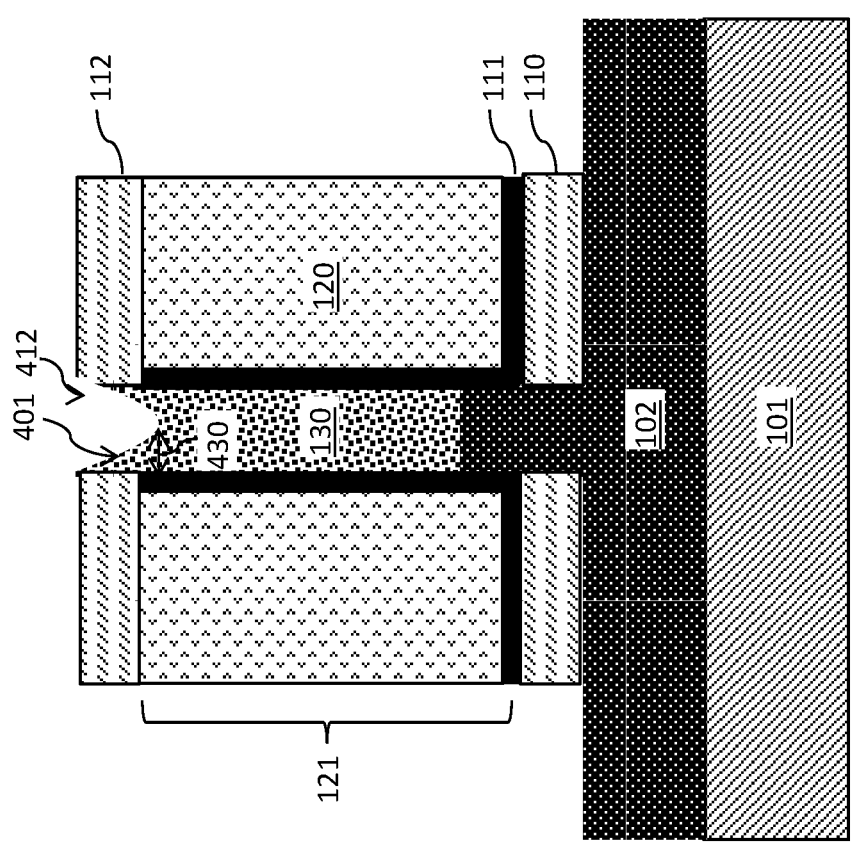

FIG. 4 is a cross-sectional side view after removing the fin hard mask 301 and etching to form a recess 412 in a top surface of the fin 130. Forming the recess 412 prevents exposure or damage to the dielectric layer 111 of the gate stack 121. The sidewalls 401 of the recess 412 form oblique angles (neither parallel nor right angles) with respect to the sidewalls of the fin 130. In embodiments, the recess 412 has a v-shape or a u-shape. The dielectric layer 111 is not exposed after etching. A portion of the semiconductor material of the fin 130 remains arranged over the dielectric layer 111 after etching. A portion of the semiconductor material of the fin 130 is also arranged between the recess 412 and the top spacer 112.

The recess 412 formed in the fin 130 thins the semiconductor material of the fin 130. In embodiments, the thickness 430 of the semiconductor material of the fin 130 between a sidewall of the fin 130 and a sidewall 401 of the recess 412 after etching is less than half the thickness before forming the recess 412. In other embodiments, the thickness 430 of the semiconductor material of the fin 130 after forming the recess 412 is in a range from about 0.5 nm to about 10 nm. Yet, in some embodiments, the thickness 430 of the semiconductor material of the fin 130 after forming the recess 412 is in a range from about 1 to about 5 nm.

The fin hard mask 301 can be removed by an etch process. Non-limiting examples of etch process include dry etch processes, such as plasma etching or reactive ion etching. Alternatively, wet etching can be used to remove the hardmask. In some embodiments, the hard mask 301 includes silicon oxide, silicon nitride, silicon oxynitride, or any combination of these materials, and a wet etch with an aqueous solution containing hydrofluoric acid can be used to remove the hard mask 301. In some embodiments, a planarization process, such as chemical mechanical polish (CMP) can be used to remove the hard mask 301 and fin above the top surface of the top spacer 112 before performing the process to form recess 412.

The etch process used to form the recess 412 can be a semiconductor wet etch process. Non-limiting examples of wet etch processes that can be used to form the recess include potassium hydroxide (KOH), ammonium hydroxide (ammonia), tetramethylammonium hydroxide (TMAH), hydrazine, or ethylene diamine pyrocatechol (EDP), or any combination thereof.

Figure 7:
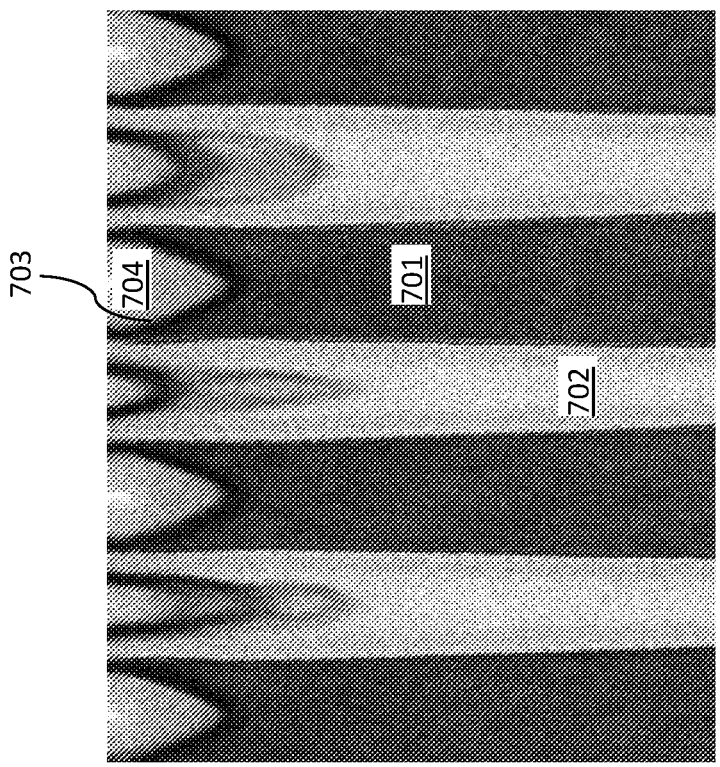
FIG. 7 is an electron micrograph of fins after performing an ammonia etch to form a v-shaped recess in the fins according to exemplary embodiments.

In embodiments, an ammonia etch can be used to form the recess 412 in the fin 130. The ammonia etch is self-limiting, meaning that it will stop etching the semiconductor fin 130 once the {111} planes are formed. For example, FIG. 7 is an electron micrograph of fins 701 after performing an ammonia etch to form a v-shaped recess 704 in the fins 701. Oxide 702 is arranged between the fins 701. As shown, the ammonia etch is self-limiting and stops once {111} planes are formed. It is noted that the dark lines 703 on the {111} planes are hafnium oxide for transmission electron microscopy (TEM) decoration.

Figure 5:
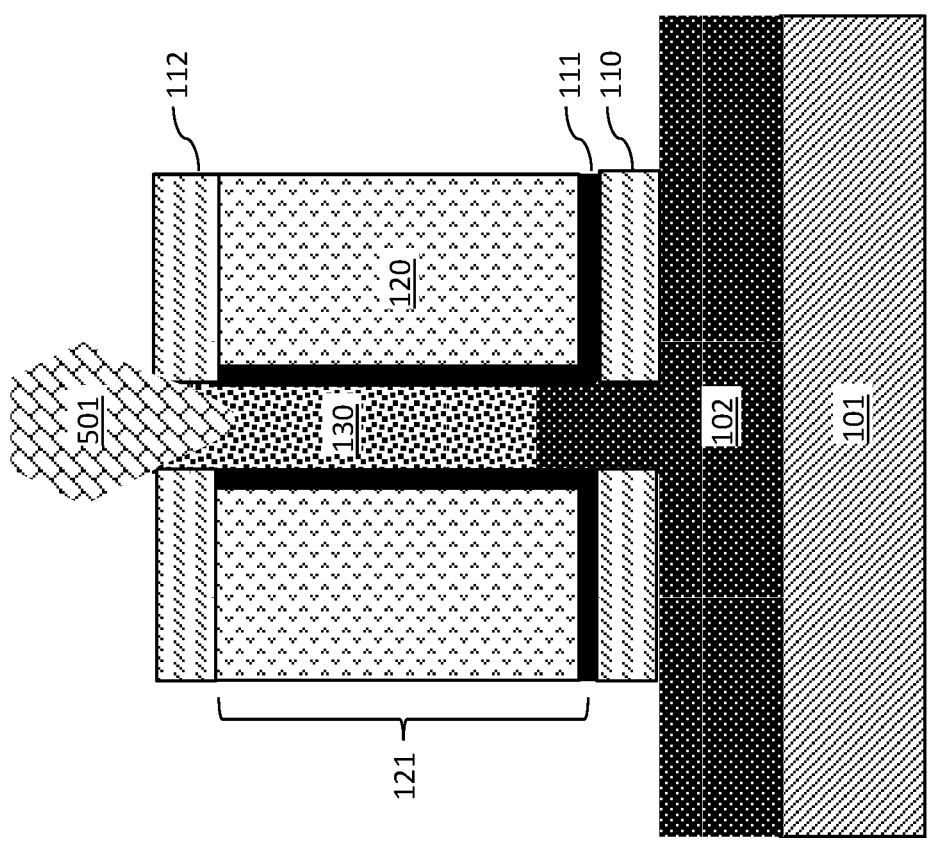

FIG. 5 is a cross-sectional side view after performing an epitaxial growth with in-situ doping to form a top source/drain 501 on the fin 130. The top source/drain 501 fills the recess in the fin 130. Due to the recess in the fin 130, the top source/drain 501 does not directly contact the dielectric layer 111 of the gate stack 121. The top source/drain 501 also does not directly contact the top spacer 112.

The top source/drain 501 can be formed by depositing an epitaxial layer onto the fin 130. Epitaxial growth can be deposited using, for example, vapor-phase epitaxy (VPE), molecular-beam epitaxy (MBE), liquid-phase epitaxy (LPE), or other suitable process. The epitaxial growth includes one or more semiconductor materials, for example, silicon, silicon germanium, or a combination thereof. The epitaxial silicon, silicon germanium, and/or carbon doped silicon (Si:C) silicon is doped during deposition (in-situ doping) by adding a dopant or impurity. The type of dopant or impurity depends on the type of transistor. The dopant can be an n-type dopant or a p-type dopant.

In exemplary embodiments, when the transistor is a pFET, a silicon germanium epitaxial layer can be doped with a p-type dopant, such as boron. When the transistor is an nFET, the Si:C epitaxial layer can be doped with an n-type dopant, such as phosphorus or arsenic. The non-limiting dopant concentration in the source/drain region range from $1E19$ $cm^{-3}$ to $2E21$ $cm^{-3}$.

Figure 6:
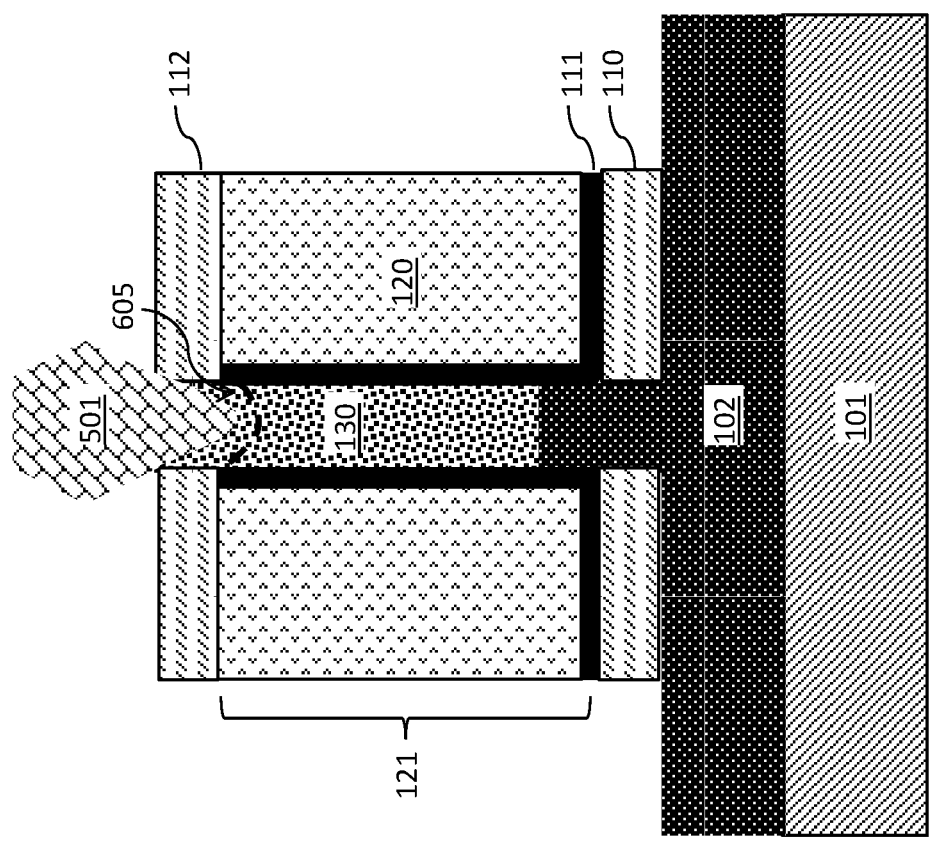

FIG. 6 is a cross-sectional side view after annealing to diffuse dopants into the fin 130 and junction. By performing an annealing process, including first heating and then cooling, the dopants diffuse into the thin semiconductor material of the fin 130 in the region 605. The diffusion process is an isotropic process in which diffusion occurs in all directions. Because the remaining semiconductor material of the fin 130, for example silicon, is thin, a high thermal budget diffusion anneal process is not necessary. Only a mild diffusion process is needed to form optimal junction overlap between the top source/drain 501 and the dielectric layer 111, such as a high-k dielectric.

In some embodiments, a laser anneal process can be used to diffuse the dopants of the top source/drain 501 into the thin semiconductor material of the fin 130. Laser annealing is performed using a laser to rapidly heat the surfaces of the top source/drain and then allowing it to self-cool. Yet in other embodiments, annealing processes can use a furnace or be performed using a rapid thermal treatment in an atmosphere containing pure inert gases (e.g., nitrogen or argon). The anneal process can be, for example, laser anneal, flash anneal, a Rapid Thermal Anneal (RTA), Rapid Thermal Processing (RTP), or any suitable combination of those annealing techniques.

In the resulting device structure shown in FIG. 6, the angled recess in the fin 130 is formed by a self-limiting etch. The dielectric layer 111 of the gate stack 121 is also fully protected by the semiconductor material of the fin 130. Thus, an optimal top source/drain 501 to gate stack 121 junction is formed.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a top source/drain junction of a vertical transistor, the method comprising:
   forming a structure comprising a bottom source/drain, a fin channel comprising a semiconductor material and extending vertically from the bottom source/drain, and a gate arranged around the fin channel, the gate comprising a dielectric layer, a gate metal, a top spacer arranged on a top surface of the gate, and a bottom spacer arranged on a bottom surface of the gate;
   etching to form a recess in a top surface of the semiconductor material of the fin channel, the recess having sidewalls that contact a top surface of the top spacer and form oblique angles with respect to sidewalls of the fin channel and sidewalls of the top spacer, and the semiconductor material of the fin channel covering sidewalls of the top spacer;
   forming a top source/drain on the fin channel and within the recess;
   doping the top source/drain with a dopant; and
   annealing to diffuse the dopants from the top source/drain into the fin channel.

2. The method of claim 1, wherein the fin channel further comprises a hard mask arranged on a top surface of the fin channel.

3. The method of claim 2, further comprising removing the hard mask before performing the etching.

4. The method of claim 1, wherein the recess is a v-shaped recess.

5. The method of claim 1, wherein the etching comprises ammonia.

6. The method of claim 1, wherein the etching is a self-limiting etch process.

7. The method of claim 1, wherein the dielectric layer of the gate is not exposed after etching.

8. A method of fabricating a top source/drain junction of a vertical transistor, the method comprising:
   forming a structure comprising a bottom source/drain, a fin channel comprising a semiconductor material and extending vertically from the bottom source/drain, and a gate arranged around the fin channel, the gate comprising a dielectric layer, a gate metal, a top spacer arranged on a top surface of the gate, and a bottom spacer arranged on a bottom surface of the gate;
   etching to form a recess in a top surface of the semiconductor material of the fin channel, the recess having sidewalls that contact a top surface of the top spacer and form oblique angles with respect to sidewalls of the fin channel and sidewalls of the top spacer, and the semiconductor material of the fin channel covering sidewalls of the top spacer;
   forming a top source/drain on the fin channel;
   doping the top source/drain with a dopant; and
   heating the top source/drain using a laser and then cooling to diffuse the dopant into the fin channel.

9. The method of claim 8, wherein the dielectric layer of the gate is a high-k dielectric layer.

10. The method of claim 8, wherein the dielectric layer of the gate is not exposed after etching, and a layer of semiconductor material of the fin channel remains arranged on the dielectric layer after etching.

11. The method of claim 8, wherein the dopant is an n-type dopant.

12. The method of claim 8, wherein the dopant is a p-type dopant.

13. The method of claim 8, wherein a thickness of semiconductor material between a sidewall of the fin channel and a sidewall of the recess after etching is less than half of an original thickness of the fin channel before etching.

* * * * *